United States Patent
Yeh et al.

(10) Patent No.: US 10,964,912 B2
(45) Date of Patent: Mar. 30, 2021

(54) PROTECTIVE STRUCTURE AND ELECTRONIC DEVICE WITH THE SAME

(71) Applicants: Industrial Technology Research Institute, Hsinchu (TW); Intellectual Property Innovation Corporation, Hsinchu (TW)

(72) Inventors: Yung-Hui Yeh, Hsinchu (TW); Jui-Chang Chuang, Kaohsiung (TW); Li-Ching Wang, Hsinchu County (TW); Cheng-Yueh Chang, Hsinchu County (TW); Chyi-Ming Leu, Hsinchu County (TW); Shih-Ming Chen, Hsinchu (TW)

(73) Assignees: Industrial Technology Research Institute, Hsinchu (TW); Intellectual Property Innovation Corporation, Hsinchu (TW)

(*) Notice: Subject to any disclaimer, the term of this patent is extended or adjusted under 35 U.S.C. 154(b) by 0 days.

(21) Appl. No.: 16/379,815

(22) Filed: Apr. 10, 2019

(65) Prior Publication Data
US 2020/0052243 A1   Feb. 13, 2020

Related U.S. Application Data

(60) Provisional application No. 62/717,001, filed on Aug. 10, 2018.

(30) Foreign Application Priority Data

Dec. 27, 2018   (TW) .................. 107147449

(51) Int. Cl.
*H01L 51/52* (2006.01)
*H01L 23/29* (2006.01)
(Continued)

(52) U.S. Cl.
CPC ............ *H01L 51/5253* (2013.01); *G02B 1/14* (2015.01); *H01L 23/293* (2013.01);
(Continued)

(58) Field of Classification Search
CPC .................................................. H01L 51/5253
(Continued)

(56) References Cited

U.S. PATENT DOCUMENTS 9,777,186 B2   10/2017   Kang et al.
9,837,635 B2   12/2017   Chang et al.
(Continued)

FOREIGN PATENT DOCUMENTS

CN   1967853   5/2007
CN   103173722   6/2013
(Continued)

OTHER PUBLICATIONS

"Office Action of Taiwan Counterpart Application," dated Dec. 24, 2019, p. 1-p. 4.
(Continued)

*Primary Examiner* — Brent T O'Hern
(74) *Attorney, Agent, or Firm* — JCIPRNET

(57) ABSTRACT

Provided is a protective structure including an auxiliary layer and a hard coating layer. The auxiliary layer has a first surface and a second surface opposite to the first surface. The hard coating layer is located on the second surface of the auxiliary layer. The Young's modulus of the auxiliary layer is gradually increased from the second surface to the first surface. An electronic device with the same is also provided.

8 Claims, 7 Drawing Sheets

100a

(51) Int. Cl.
  *G02B 1/14* (2015.01)
  *H01L 27/32* (2006.01)
(52) U.S. Cl.
  CPC ........ *H01L 27/323* (2013.01); *H01L 27/3244* (2013.01); *H01L 51/5281* (2013.01); *H01L 2251/5338* (2013.01); *H01L 2251/558* (2013.01)
(58) Field of Classification Search
  USPC ........................................................ 428/212
  See application file for complete search history.

(56) References Cited

U.S. PATENT DOCUMENTS

| | | | |
|---|---|---|---|
| 2017/0179434 A1* | 6/2017 | Chang | ................. H01L 51/5256 |
| 2017/0253746 A1 | 9/2017 | Lim et al. | |
| 2019/0049630 A1* | 2/2019 | Chuang | .................... B32B 7/12 |

FOREIGN PATENT DOCUMENTS

| | | |
|---|---|---|
| CN | 103192558 | 7/2013 |
| CN | 104608445 | 5/2015 |
| CN | 105109170 | 12/2015 |
| CN | 107068892 | 8/2017 |
| CN | 108122927 | 6/2018 |
| JP | 2000071392 | 3/2000 |
| JP | 2000084477 | 3/2000 |
| JP | 2003266587 | 9/2003 |
| JP | 2015086406 | 5/2015 |
| TW | I527207 | 3/2016 |
| TW | 201724922 | 7/2017 |
| TW | 201800506 | 1/2018 |
| TW | 201813812 | 4/2018 |
| TW | I625073 | 5/2018 |
| WO | 2018057774 | 3/2018 |

OTHER PUBLICATIONS

"Office Action of China Counterpart Application", dated Jan. 26, 2021, p. 1-p. 8.

* cited by examiner

PROTECTIVE STRUCTURE AND ELECTRONIC DEVICE WITH THE SAME

CROSS-REFERENCE TO RELATED APPLICATION

This application claims the priority benefits of U.S. provisional application Ser. No. 62/717,001, filed on Aug. 10, 2018, and Taiwan application serial no. 107147449, field on Dec. 27, 2018. The entirety of the above-mentioned patent applications are hereby incorporated by reference herein.

TECHNICAL FIELD

The disclosure is related to a protective structure and an electronic device with the same.

BACKGROUND

As technology advances, electronic elements (such as soft electronic elements) often are provided with a hard coating layer (HC) on the surface to improve the scratch resistance thereof. However, when the thickness of the hard coating layer is increased, although the scratch resistance of the electronic element may be improved, the flexibility of the element is lowered. In addition, a surface or edge material cracking phenomenon occurs to the current hard coating layer structure after repeated folding, and phenomenon such as delamination of the bottom substrate may even occur, especially when the element is folded outward, since the hard coating layer needs to withstand greater stress, and the material cracking phenomenon more readily occurs after repeated outward folding. Therefore, how to overcome the above technical issues has become one of the issues that urgently need to be solved at present.

SUMMARY

A protective structure of an embodiment of the disclosure includes an auxiliary layer and a hard coating layer. The auxiliary layer has a first surface and a second surface opposite to the first surface. The hard coating layer is located on the second surface of the auxiliary layer. The Young's modulus of the auxiliary layer is gradually increased from the second surface toward the first surface.

A protective structure of an embodiment of the disclosure includes a substrate and a hard coating layer. The hard coating layer is located on the substrate. The hard coating layer has a first surface adjacent to the substrate and a second surface opposite to the first surface. The Young's modulus of the hard coating layer is gradually increased from the second surface toward the first surface.

A protective structure of an embodiment of the disclosure includes an auxiliary layer and a hard coating layer. The auxiliary layer has a first surface and a second surface opposite to the first surface. The hard coating layer is located on the second surface of the auxiliary layer. The Young's modulus of the auxiliary layer is greater than the Young's modulus of the hard coating layer, and the material of the auxiliary layer includes the same material as the hard coating layer.

An electronic device of an embodiment of the disclosure includes any of the protective structures above and an electronic element.

Several exemplary embodiments accompanied with figures are described in detail below to further describe the disclosure in details.

BRIEF DESCRIPTION OF THE DRAWINGS

The accompanying drawings are include to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
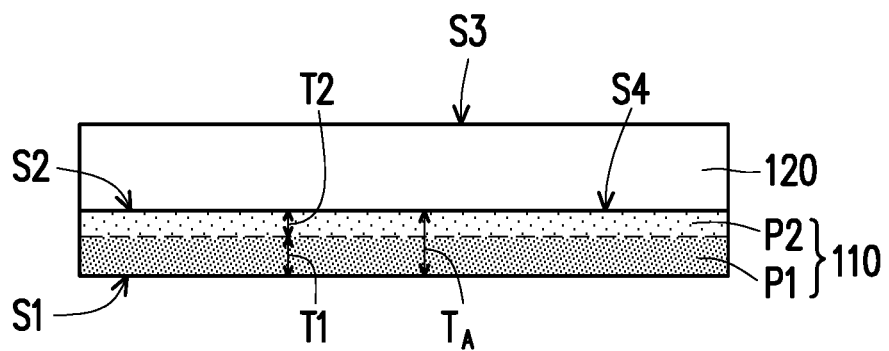
FIG. 1A, FIG. 1B, FIG. 2A, FIG. 2B, FIG. 3A, and FIG. 3B are cross sections of a protective structure according to some embodiments of the disclosure.

The following disclosure of the specification provides various embodiments or examples to implement various features of the various embodiments of the disclosure. The disclosure of the present specification describes specific examples of each element and their configuration in order to simplify the description. Of course, these specific examples are not intended to limit the disclosure. In addition, different examples in the description of the disclosure may adopt repeated reference numerals and/or wording. These repeated reference numerals or wording are not intended to limit the relationship of the various embodiments and/or the exterior structures for the purpose of simplicity and clarity. Furthermore, the disclosure of the present specification describing the forming of a first feature on or above a second feature includes an embodiment in which the formed first feature is in direct contact with the second feature, and also includes an embodiment in which an additional feature may be formed between the first feature and the second feature, such that the first feature may not be in direct contact with the second feature. In addition, the concentration referred to in the present specification may represent a weight percent concentration (wt %) or a volume percent concentration (vol %) unless otherwise specified. The dimensions of the elements in the drawings are drawn for convenience of description and do not represent their actual element size ratios.

An embodiment of the disclosure provides a protective structure and an electronic device having improved scratch resistance and having good flexibility at the same time, and the material cracking phenomenon after the electronic device is folded (especially folded outward) may also be reduced, thereby increasing the service life and reliability of the electronic device.

Referring to FIG. 1A, a protective structure 100a includes an auxiliary layer 110 and a hard coating layer 120 located on the auxiliary layer 110. The auxiliary layer 110 may be a scratch resistant auxiliary layer, and the hard coating layer 120 may be a protective anti-stress layer. The auxiliary layer 110 has a first surface S1 and a second surface S2 opposite to the first surface S1. The hard coating layer 120 has a top surface S3 and a bottom surface S4 opposite to the top surface S3. The hard coating layer 120 is located on the second surface S2 of the auxiliary layer 110. In some embodiments, the second surface S2 of the auxiliary layer 110 is closer to the hard coating layer 120 than the first surface S1 of the auxiliary layer 110. In some embodiments, the bottom surface S4 of the hard coating layer 120 is in direct contact with the second surface S2 of the auxiliary layer 110. In some embodiments, the auxiliary layer 110 and the hard coating layer 120 may be unpatterned layers. In other words, the hard coating layer 120 may completely cover the second surface S2 of the auxiliary layer 110.

The Young's modulus of the auxiliary layer 110 is different from the Young's modulus of the hard coating layer 120. In some embodiments, the Young's modulus of the hard coating layer 120 is less than or equal to the Young's modulus of the auxiliary layer 110. In some embodiments, the Young's modulus of the hard coating layer 120 is a constant, and the Young's modulus of the auxiliary layer 110 is a gradient. The Young's modulus of the hard coating layer 120 is almost kept a constant from the top surface S3 to the bottom surface S4 and is less than or equal to the Young's modulus of the auxiliary layer 110. The Young's modulus of the auxiliary layer 110 is gradually increased from the second surface S2 toward the first surface S1.

In some embodiments, the Young's modulus of the hard coating layer 120 may be 1 to 60 GPa ($10^9$ Pa). In some embodiments, the Young's modulus of the hard coating layer 120 may be 1 to 40 GPa. In some embodiments, the Young's modulus of the hard coating layer 120 may be 1 to 30 GPa. In some embodiments, the Young's modulus of the auxiliary layer 110 may be 5 to 100 GPa. In some embodiments, the Young's modulus of the auxiliary layer 110 may be 5 to 60 GPa. In some embodiments, the Young's modulus of the auxiliary layer 110 may be 5 to 40 GPa. In some embodiments, the ratio of the Young's modulus of the hard coating layer 120 to the Young's modulus of the auxiliary layer 110 may range from 0.01 to 1. In some embodiments, the ratio of the Young's modulus of the hard coating layer 120 to the Young's modulus of the auxiliary layer 110 may range from 0.016 to 1. In some embodiments, the ratio of the Young's modulus of the hard coating layer 120 to the Young's modulus of the auxiliary layer 110 may range from 0.025 to 1.

The auxiliary layer 110 may include an organic material, and the organic material may be doped with an inorganic material. In some embodiments, the organic material may be a photocurable material, but the disclosure is not limited thereto. In some embodiments, the organic material may be a monomer material, a polymer material, or a combination of the foregoing. The organic material may be a monomer material having a molecular weight of 60 g/mol to 500 g/mol or a polymer material having a weight-average molecular weight (Mw) of 500 g/mol to 200,000 g/mol. The organic material may include pentaerythritol trimethacrylate, acrylate material, or a combination of the foregoing. In some embodiments, the acrylic structural formula may be represented by the following Formula (1)

Formula (1)

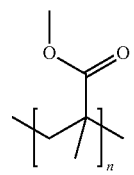

wherein n is, for example, 1 to 2000.

The inorganic material of the auxiliary layer 110 may be a high hardness material. That is, the hardness of the inorganic material may be higher than the hardness of the organic material so as to increase the Young's modulus of the auxiliary layer 110 by doping the inorganic material. In other words, the doping concentration of the inorganic material of the auxiliary layer 110 is positively correlated with the Young's modulus thereof, and the Young's modulus of the auxiliary layer 110 may be changed by adjusting the doping concentration of the inorganic material, so that the Young's modulus of the auxiliary layer 110 is gradually increased from the second surface S2 toward the first surface S1. In some embodiments, the concentration of the inorganic material is gradually increased from 5 wt % to 45 wt % (weight percent concentration), and the Young's modulus of the auxiliary layer 110 at the second surface S2 is gradually increased from 5 GPa such that the Young's modulus of the auxiliary layer 110 at the first surface S1 is increased to 7 to 10 GPa, but the disclosure is not limited thereto.

The inorganic material is, for example, a ceramic material. The ceramic material is, for example, an oxide. The oxide may include modified or unmodified silicon dioxide, titanium oxide, zirconium oxide, or a combination thereof. The inorganic material is, for example, a nanoparticle. In some embodiments, the particle size of the inorganic material may be less than 50 nm. In some other embodiments, the particle size of the inorganic material may be between 20 nm and 30 nm. In still other embodiments, the particle size of the inorganic material may be between 10 nm and 30 nm. Further, in some embodiments, the average particle size of the inorganic material may be less than 50 nm. In some other embodiments, the average particle size of the inorganic material may be between 20 nm and 30 nm. In still other embodiments, when the average particle size of the inorganic material is less than 25 nm, the transmittance of the subsequently completed electronic device may be improved, but the disclosure is not limited thereto.

In an embodiment, the organic material is, for example, an acrylic material, and the inorganic material is, for example, silicon dioxide. The structural formula of the acrylic material may be represented by the following Formula (2) or Formula (3).

Formula (2)

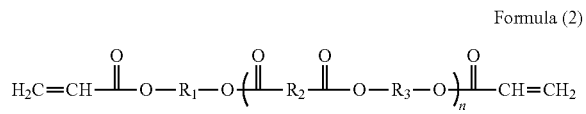

wherein $R_1$ and $R_3$ are branched or straight alkyl chains (for example, C1 to 20 alkyl groups), $R_2$ is an alkylene group (for example, $-(CH_2)_x-$, and x is an integer between 1 and 20), and n is greater than or equal to 1.

Formula (3)

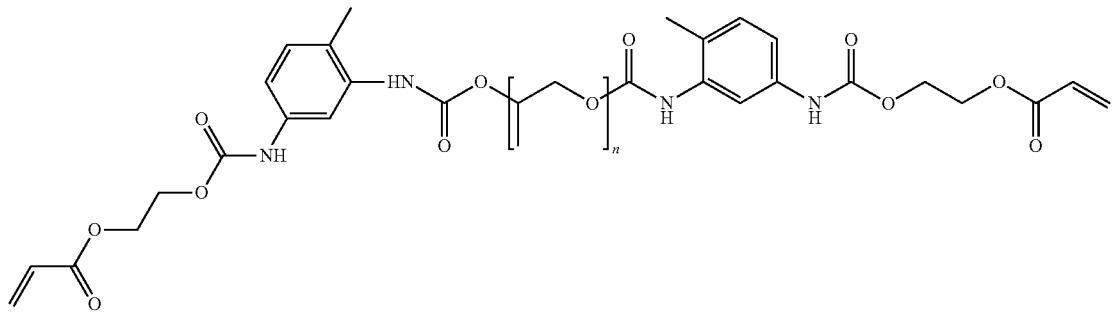

wherein n is 0 or greater than or equal to 1.

In another embodiment, the organic material is, for example, an epoxy resin, and the inorganic material is, for example, silicon dioxide. The structural formula of the epoxy resin may be represented by Formula (4) below.

Formula (4)

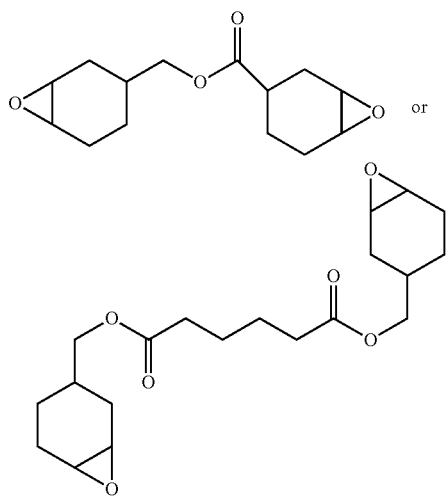

In some embodiments, the method of doping the inorganic material in the organic material may include first uniformly dispersing the inorganic material in the organic material using a solvent. For example, a solvent (such as an ester solvent such as EA) may be used to uniformly disperse a polar inorganic material in a non-polar organic material. Next, a soft bake and a curing process are performed to volatilize the solvent in the organic material. In some embodiments, the soft bake temperature is, for example, 85° C. to 105° C. The photocuring process may be performed, for example, using ultraviolet light (UV). In some embodiments, the photocuring energy is, for example, 500 mj (mini joule) to 4500 mj. In some embodiments, the photocuring energy is, for example, 500 mj to 2500 mj.

Since the volatilization of the solvent causes the polar inorganic material to not be effectively and uniformly dispersed in the non-polar organic material, the inorganic material in the organic material is deposited by gravity to the first surface S1 of the auxiliary layer 110, and therefore the doping concentration of the inorganic material is higher toward the first surface S1 of the auxiliary layer 110. In some embodiments, the inorganic material may be surface modified prior to doping such that the inorganic material is more uniformly dispersed in the organic material prior to the step of photocuring, thereby enhancing the effect of subsequent deposition. In other embodiments, the inorganic material in the auxiliary layer 110 may achieve the doping effect thereof more effectively via a method of controlling the process parameters such as adjusting the soft bake temperature, the photocuring energy, and the like.

The hard coating layer 120 may include an organic material. In an embodiment, the hard coating layer 120 may be an organic material that is not doped with an inorganic material. In another embodiment, the hard coating layer 120 may also be an organic material lightly doped with an inorganic material, and the concentration of the inorganic material may be between 3 wt % and 25 wt %. The organic material and the inorganic material of the hard coating layer 120 may be the same as or similar to the organic material and the inorganic material of the above auxiliary layer 110, and are not repeated herein.

In an embodiment in which the hard coating layer 120 is an organic material not doped with an inorganic material, the organic material of the auxiliary layer 110 may be the same as the organic material of the hard coating layer 120 to enhance the adhesion of the interface between the auxiliary layer 110 and the hard coating layer 120 so as to reduce the possibility of separation between the auxiliary layer 110 and the hard coating layer 120. For example, the organic material of the auxiliary layer 110 and the organic material of the hard coating layer 120 may be acrylic materials.

In an embodiment in which the hard coating layer 120 is an organic material lightly doped with an inorganic material, the organic material of the auxiliary layer 110 may be the same as the organic material of the hard coating layer 120. In other words, the auxiliary layer 110 and the hard coating layer 120 use the same organic material as the host material to improve the adhesion of the interface between the auxiliary layer 110 and the hard coating layer 120 to reduce the possibility of separation between the auxiliary layer 110 and the hard coating layer 120. In some embodiments, the inorganic material doped in the hard coating layer 120 may be the same as the inorganic material doped in the auxiliary layer 110, and the concentration of the inorganic material doped in the hard coating layer 120 is less than or equal to the concentration of the inorganic material doped in the auxiliary layer 110. In some embodiments, the inorganic material doped in the hard coating layer 120 may be different from the inorganic material doped in the auxiliary layer 110, and the concentrations of the inorganic materials of the hard coating layer 120 and the concentrations of the inorganic materials of the auxiliary layer 110 may be determined according to actual design, and any concentration is within the scope of the disclosure provided the Young's modulus of the auxiliary layer 110 is gradually increased from the second surface S2 toward the first surface S1.

Referring further to FIG. 1A, in some embodiments, the auxiliary layer 110 has a first portion P1 and a second portion P2 located on the first portion P1. The first portion P1 is a portion of the auxiliary layer 110 away from the hard coating layer 120, the second portion P2 is a portion of the auxiliary layer 110 adjacent to the hard coating layer 120, and the first portion P1 is farther away from the hard coating layer 120 than the second portion P2. The lower surface of the first portion P1 is the first surface S1 of the auxiliary layer 110, the upper surface of the second portion P2 is the second surface S2 of the auxiliary layer 110, and the second portion P2 is located between the first portion P1 and the hard coating layer 120.

The ratio of a thickness T1 of the first portion P1 of the auxiliary layer 110 to a total thickness $T_A$ of the auxiliary layer 110 is greater than the ratio of a thickness T2 of the second portion P2 of the auxiliary layer 110 to the total thickness $T_A$ of the auxiliary layer 110. The thickness T1 of the first portion P1 is, for example, 4/5 to 9/10 of the total thickness $T_A$ of the auxiliary layer 110, and the thickness T2 of the second portion P2 is, for example, 1/5 to 1/10 of the thickness $T_A$ of the auxiliary layer 110. In some embodiments, the Young's modulus of the first portion P1 may be a gradient, the Young's modulus of the second portion P2 may be kept a constant or be a gradient, and the Young's modulus of the hard coating layer 120 may be kept a constant or be a gradient. In some embodiments, the Young's modulus of the first portion P1 is greater than the Young's modulus of the hard coating layer 120, the Young's modulus of the second portion P2 is greater than or equal to the Young's modulus of the hard coating layer 120, and the Young's modulus of the first portion P1 is greater than the Young's modulus of the second portion P2. The minimum value of the Young's modulus in the first portion P1 is greater than the maximum value of the Young's modulus of the hard coating layer 120, the minimum value of the Young's modulus of the second portion P2 is greater than or equal to the maximum value of the Young's modulus of the hard coating layer 120, and the minimum value of the Young's modulus of the first portion P1 is greater than the maximum value of the Young's modulus of the second portion P2. In some embodiments, the Young's modulus of the first portion P1 is 5 to 50 GPa, and the Young's modulus of the second portion P2 is 3 to 20 GPa, but the disclosure is not limited thereto. In some embodiments, the Young's modulus of the first portion P1 is 7 to 45 GPa, and the Young's modulus of the second portion P2 is 4 to 20 GPa, but the disclosure is not limited thereto.

The weight percent concentration of the inorganic material of the first portion P1 is greater than the weight percent concentration of the inorganic material of the second portion P2. In some embodiments, the concentration of the inorganic material of the first portion P1 is 10 wt % to 60 wt %, or 5 vol % to 30 vol %. The concentration of the inorganic material of the second portion P2 is 0 wt % to 20 wt %, or 0 vol % to 10 vol %. In other words, the first portion P1 is doped with an inorganic material, and the second portion P2 may not be doped with an inorganic material, or is lightly doped with an inorganic material.

It should be noted that the disclosure does not limit the method in which the Young's modulus of the auxiliary layer 110 is gradually increased from the second surface S2 toward the first surface S1, such as doping with an inorganic material, and any method is within the scope of the disclosure as long as the Young's modulus of the auxiliary layer 110 is gradually increased from the second surface S2 toward the first surface S1.

Figure 1B:
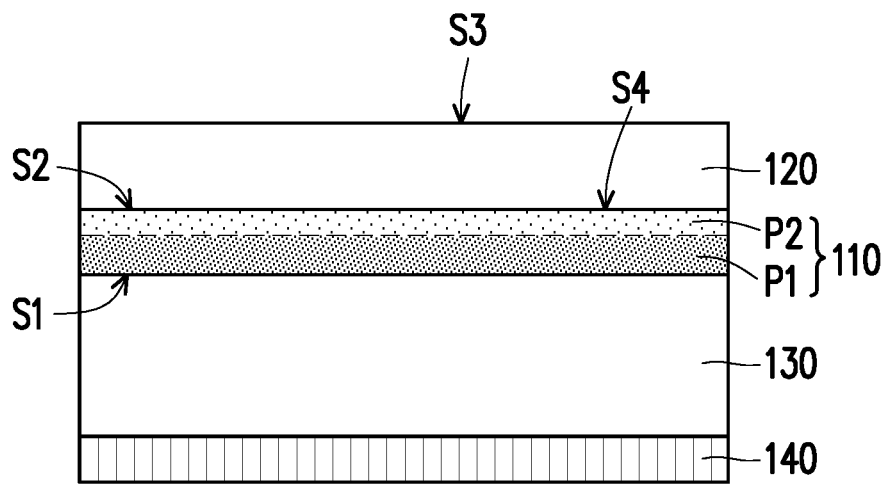

FIG. 1B is a cross section of a protective structure according to another embodiment of the disclosure.

Referring to FIG. 1B, a protective structure 100b is similar to the protective structure 100a of FIG. 1A, and the difference is that the protective structure 100b further includes a substrate 130 and an optical structure layer 140. In the embodiment, one side of the substrate 130 is the auxiliary layer 110, and another side of the substrate 130 is the optical structure layer 140.

The substrate 130 may be a single material substrate, such as an organic material or inorganic material. The organic material may include, for example, polyimine (PI), polymethyl methacrylate (PMMA), polycarbonate (PC), polyethersulfone (PES), polyamine (PA), polyethylene terephthalate (PET), polyether ether ketone (PEEK), polyethylene naphthalate (PEN), polyethyleneimine (PEI), polyurethane (PU), polydimethyl siloxane (PDMS), acrylic, polyvinylidene fluoride (PVDF), polyvinyl alcohol (PVA), ether-containing polymer, polyolefin, or a combination of the above, but is not limit thereto. The material of the inorganic material includes single metal, metal oxide, non-metal oxide, non-metal nitride, ceramic, or the like, or a composite material composed of the above materials, but is not limited thereto. The inorganic material is, for example, diamond-like carbon (DLC), silicon nitride, silicon oxide, silicon oxynitride, aluminum oxide, aluminum titanium dioxide, titanium oxide, titanium oxynitride, or a solution gas barrier (SGB) (SGB is, for example, polysilazane), and the like. In some embodiments, the substrate 130 may be a composite substrate including an organic material and an inorganic material. The composite substrate of the organic material and the inorganic material refers to a substrate formed by mixing an organic material and an inorganic material.

In some embodiments, the optical structure layer 140 may be a circular polarizer (CPL) or a light filter structure. The CPL is, for example, a polarizing layer and a phase retardation layer, wherein the polarizing layer may be a linear polarizing layer, and the phase retardation layer may be a ¼ wavelength retardation layer. The light filter structure is, for example, a black filter layer, a color filter layer, or a combination of both.

The Young's modulus of the substrate 130 is different from the Young's modulus of the hard coating layer 120. In some embodiments, the Young's modulus of the substrate 130 is less than the Young's modulus of the auxiliary layer 110 and less than the Young's modulus of the hard coating layer 120. The Young's modulus of the substrate 130 is, for example, 3 to 10 GPa. In other words, the order of the Young's modulus of each layer of the protective structure 100b is, from low to high, the substrate 130, the hard coating layer 120, and the auxiliary layer 110. The Young's modulus of the optical structure layer 140 may be 1 to 20 GPa, and the thickness thereof may be 1 to 50 μm (micrometer).

In some embodiments, the manufacturing method of the protective structure 100b may include first coating a solution including a solvent and an organic material doped with an inorganic material on a surface of the substrate 130, followed by a soft bake process. Next, a photocuring process is performed to form the auxiliary layer 110. Thereafter, a solution including an organic material is coated on the auxiliary layer 110, and then a photocuring process is performed to form the hard coating layer 120. The optical structure layer 140 may be attached to another surface of the substrate 130 via an adhesive layer (not shown), or directly formed on the substrate 130 via wet coating or dry film forming.

In other embodiments, the protective structure is similar to the protective structure 100b described above, but does not include the optical structure layer 140.

Figure 1C:
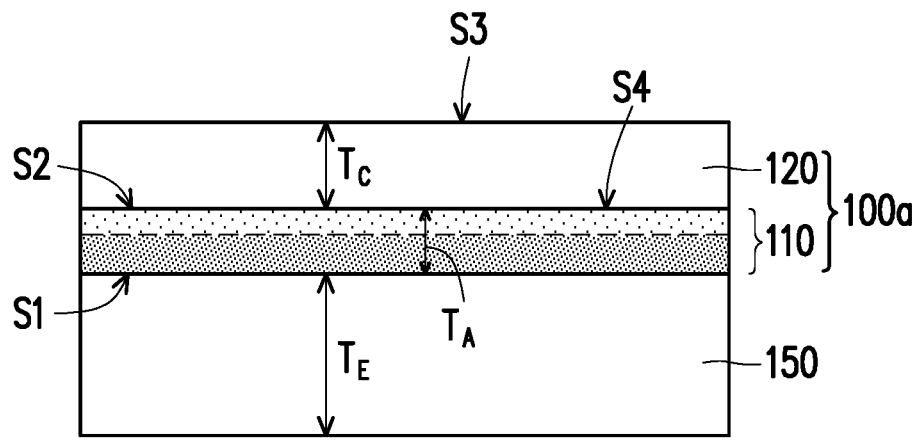
FIG. 1C, FIG. 1D, FIG. 2C, FIG. 2D, FIG. 3C, and FIG. 3D are cross sections of an electronic device according to some embodiments of the disclosure.

FIG. 1C is a cross section of an electronic device having a protective structure according to some embodiments of the disclosure.

Referring to FIG. 1C, an electronic device 100c includes a protective structure 100a as shown in FIG. 1A and an electronic element 150. The protective structure 100a is disposed on the electronic element 150. In some embodiments, the electronic element 150 is in contact with the first surface S1 of the auxiliary layer 110. In another embodiment, the protective structure 100a may be bonded to the electronic element 150 via an adhesive layer (not shown) to form the electronic device 100c, but is not limited thereto.

The material of the adhesive layer is, for example, a resin film, an optical transparent adhesive (OCA), a hot melt adhesive, an optical pressure sensitive adhesive (PSA), or an optical pressure sensitive resin (OCR), but the disclosure is not limited thereto. In some embodiments, the electronic element 150 may be a wire, an electrode, a resistor, an inductor, a capacitor, a transistor, a diode, a switching element, an amplifier, a processor, a controller, a thin film transistor, a touch element, a pressure sensing element, a microelectromechanical element, a feedback element, a display, a touch display element, a single chip module, a multi-chip module, an OLED (organic light-emitting diode) lighting, or other suitable electronic elements. In other embodiments, the electronic element 150 may also be an optical element or an element having a light filter, but the disclosure is not limited thereto. In an embodiment, the display may be an active matrix display or a passive matrix display, and the active matrix display may be an organic light-emitting diode (OLED) display, a micro LED (micro light-emitting diode) or other suitable displays.

In some embodiments, the Young's modulus of the electronic element 150 may be 15 to 100 GPa, the Young's modulus of the auxiliary layer 110 may be 5 to 100 GPa, and the Young's modulus of the hard coating layer 120 may be 1 to 60 GPa. In still other embodiments, the Young's modulus of the electronic element 150 may be 15 to 100 GPa, the Young's modulus of the auxiliary layer 110 may be 5 to 60 GPa, and the Young's modulus of the hard coating layer 120 may be 1 to 40 GPa. In some other embodiments, the Young's modulus of the electronic element 150 may be 15 to 100 GPa, the Young's modulus of the auxiliary layer 110 may be 5 to 40 GPa, and the Young's modulus of the hard coating layer 120 may be 1 to 30 GPa.

In some embodiments, the ratio of the Young's modulus of the hard coating layer 120 to the Young's modulus of the auxiliary layer 110 may range from 0.01 to 1, and the ratio of the Young's modulus of the auxiliary layer 110 to the Young's modulus of the electronic element 150 may range from 0.1 to 6.7. In other embodiments, the ratio of the Young's modulus of the hard coating layer 120 to the Young's modulus of the auxiliary layer 110 may range from 0.016 to 1, and the ratio of the Young's modulus of the auxiliary layer 110 to the Young's modulus of the electronic element 150 may range from 0.1 to 4. In still other embodiments, the ratio of the Young's modulus of the hard coating layer 120 to the Young's modulus of the auxiliary layer 110 may range from 0.025 to 1, and the ratio of the Young's modulus of the auxiliary layer 110 to the Young's modulus of the electronic element 150 may range from 0.1 to 2.7.

Referring further to FIG. 1C, in some embodiments, a thickness $T_E$ of the electronic element 150 in the protective structure 100c may be 30 to 200 µm, the thickness $T_A$ of the auxiliary layer 110 may be 10 to 40 µm, and a thickness $T_C$ of the hard coating layer 120 may be 1 to 30 µm. In some embodiments, the ratio of the thickness $T_C$ of the hard coating layer 120 to the thickness $T_A$ of the auxiliary layer 110 (i.e., $T_C/T_A$) may range from 0.025 to 3, and the ratio of the thickness $T_A$ of the auxiliary layer 110 to the thickness $T_E$ of the electronic element 150 (i.e., $T_A/T_E$) may range from 0.05 to 1.4.

Figure 1D:
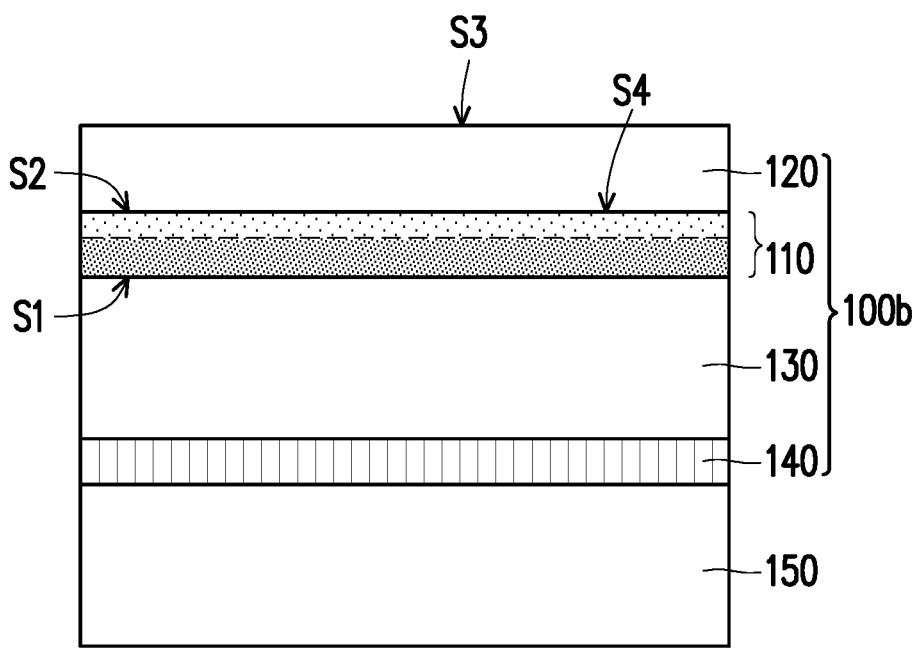

FIG. 1D is a cross section of an electronic device having a protective structure according to some other embodiments of the disclosure.

Referring to FIG. 1D, an electronic device 100d includes the protective structure 100b as shown in FIG. 1B and the electronic element 150. The protective structure 100b is disposed on the electronic element 150. In some embodiments, the surface of the electronic element 150 may be in contact with the surface of the optical structure layer 140 away from the substrate 130. In other words, the optical structure layer 140 is disposed between the electronic element 150 and the substrate 130. The characteristics of the remaining layers other than the electronic element 150 in the electronic device 100d are the same as or similar to the protective structure 100b of FIG. 1B. The Young's modulus of the electronic element 150 may be 15 to 100 GPa.

Since the Young's modulus of the auxiliary layer 110 of the protective structures 100a to 100b of FIG. 1A and FIG. 1B is gradually increased from the second surface S2 toward the first surface S1, the electronic device 100c having the protective structure 100a (FIG. 1C) and the electronic device 100d having the protective structure 100b (FIG. 1D) may have improved scratch resistance and have good flexibility at the same time. Therefore, the material cracking phenomenon of the electronic devices 100c to 100d after folding (especially outward folding) may be reduced, thereby increasing the service life and reliability of the electronic devices 100c to 100d.

It is to be noted that the following embodiments adopt the same reference numerals and some of the content of the above embodiments, wherein the same reference numerals are used to refer to the same or similar elements, and descriptions of the same technical content are omitted. The description of the omitted portions is provided in the foregoing embodiments and is not repeated in the following embodiments.

Figure 2A:
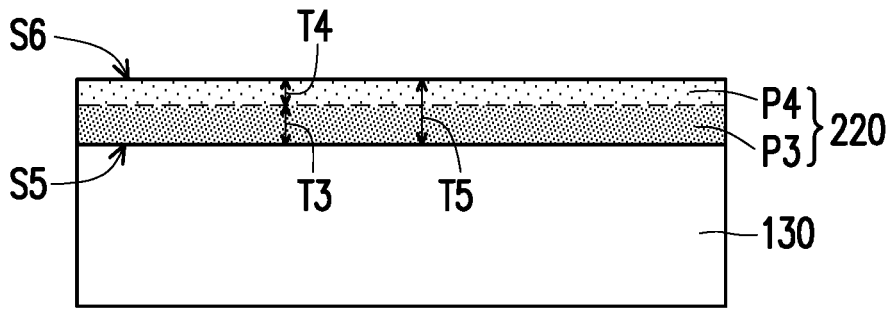

Referring to FIG. 2A, a protective structure 200a includes the substrate 130 and a hard coating layer 220 located on the substrate 130. The hard coating layer 220 has a first surface S5 adjacent to the substrate 130 and a second surface S6 opposite to the first surface S5. The substrate 130 is located on the first surface S5 of the hard coating layer 220. The Young's modulus of the hard coating layer 220 is different from the Young's modulus of the substrate 130. In some embodiments, the Young's modulus of the hard coating layer 220 is greater than the Young's modulus of the substrate 130. In some embodiments, the Young's modulus of the substrate 130 is a constant, and the Young's modulus of the hard coating layer 220 is a gradient. The Young's modulus of the substrate 130 is kept a constant from the top to the bottom and is less than the Young's modulus of the hard coating layer 220. The Young's modulus of the hard coating layer 220 is gradually increased from the second surface S6 toward the first surface S5. The Young's modulus of the hard coating layer 220 ranges, for example, from 1 GPa to 100 GPa.

In some embodiments, the hard coating layer 220 may include an organic material and an inorganic material may be doped in the organic material. The doping concentration of the inorganic material is positively correlated with the Young's modulus of the hard coating layer 220, so the Young's modulus of the hard coating layer 220 may be changed by adjusting the doping concentration of the inorganic material. Gradually increasing the concentration of the inorganic material from 2 wt % to 50 wt % may cause the Young's modulus of the hard coating layer 220 to be gradually increased from the second surface S6 toward the first surface S5, but the disclosure is not limited thereto. The inorganic material and organic material of the hard coating layer 220 may be similar to those described for the inorganic material and the organic material of the auxiliary layer 110 of FIG. 1A, and details are not repeated herein.

In some embodiments, the manufacturing method of the protective structure 200a may include first coating a solution including a solvent and an organic material doped with an inorganic material on the substrate 130, followed by a soft bake process. Next, a photocuring process is performed to form the hard coating layer 220.

Referring further to FIG. 2A, the hard coating layer 220 has a first portion P3 and a second portion P4 located on the first portion P3. The first portion P3 is a portion of the hard coating layer 220 adjacent to the substrate 130, and the second portion P4 is a portion of the hard coating layer 220 away from the substrate 130. That is, the first portion P3 is located between the second portion P4 and the substrate 130. In other words, the lower surface of the first portion P3 is the first surface S5 of the hard coating layer 220, and the upper surface of the second portion P4 is the second surface S6 of the hard coating layer 220.

In some embodiments, the Young's modulus of the first portion P3 and the Young's modulus of the second portion P4 are both greater than the Young's modulus of the substrate 130, and the Young's modulus of the first portion P3 is greater than the Young's modulus of the second portion P4. In some embodiments, the Young's modulus of the first portion P3 is 5 to 50 GPa, and the Young's modulus of the second portion P4 is 3 to 20 GPa, but the disclosure is not limited thereto.

In the hard coating layer 220, the average doping concentration of the inorganic material of the first portion P3 is greater than the average doping concentration of the inorganic material of the second portion P4. In some embodiments, the concentration of the inorganic material of the first portion P3 is 10 wt % to 60 wt %, or 5 vol % to 30 vol %. The concentration of the inorganic material of the second portion P4 is 0 wt % to 20 wt %, or 0 vol % to 10 vol %. In some embodiments, the concentration of the inorganic material doped in the first portion P3 is 10 wt % to 60 wt %, or 5 vol % to 30 vol %. The concentration of the inorganic material doped in the second portion P4 is 2 wt % to 20 wt %, or 1 vol % to 10 vol %.

The method of doping the inorganic material of the disclosure is not particularly limited as long as the Young's modulus of the hard coating layer 220 is gradually increased from the second surface S6 toward the first surface S5, and any method satisfying the condition is within the scope of the disclosure.

Further, in some embodiments, a thickness T3 of the first portion P3 is greater than a thickness T4 of the second portion P4. In some embodiments, the thickness T3 of the first portion P3 may be $4/5$ to $9/10$ of the thickness T5 of the hard coating layer 220, and the thickness T4 of the second portion P4 may be $1/5$ to $1/10$ of the thickness T5 of the hard coating layer 220.

Figure 2B:
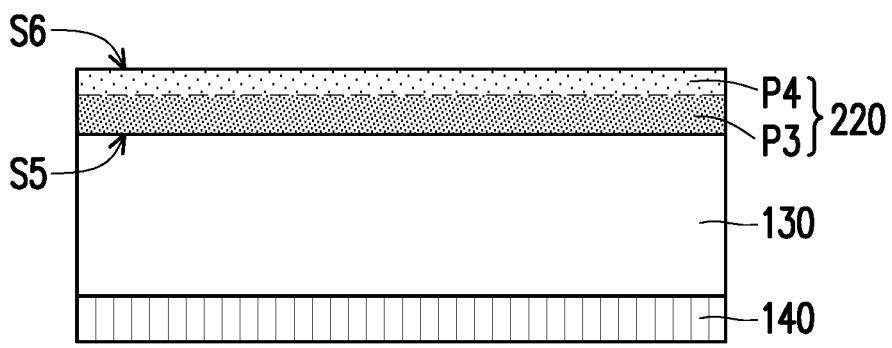

Referring to FIG. 2B, a protective structure 200b is similar to the protective structure 200a of FIG. 2A, and the difference is that the protective structure 200b further includes the optical structure layer 140. In the embodiment, one side of the substrate 130 is the hard coating layer 220, and another side of the substrate 130 is the optical structure layer 140. In some other embodiments, the protective structure is similar to the protective structure 200b, but does not include the optical structure layer 140.

Figure 2C:
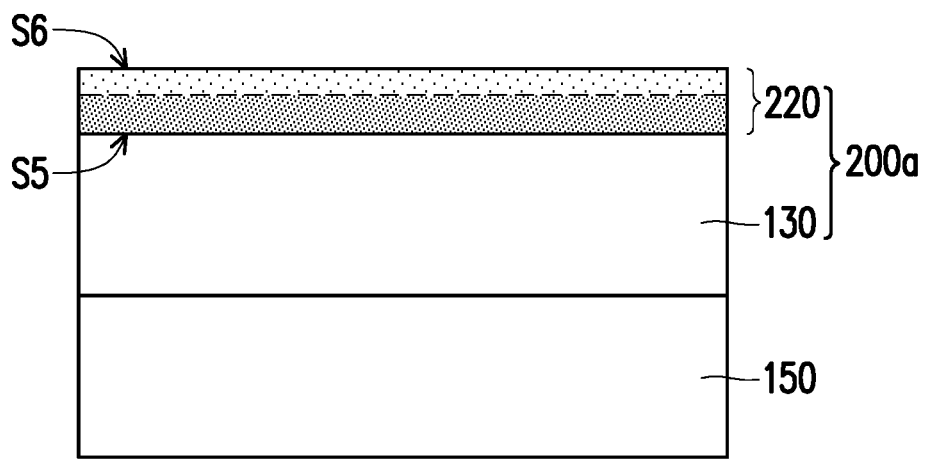

Referring to FIG. 2C, an electronic device 200c includes the protective structure 200a as shown in FIG. 2A and the electronic element 150. The protective structure 200a is disposed on the electronic element 150. In other words, the substrate 130 is sandwiched between the hard coating layer 220 and the electronic element 150.

Figure 2D:
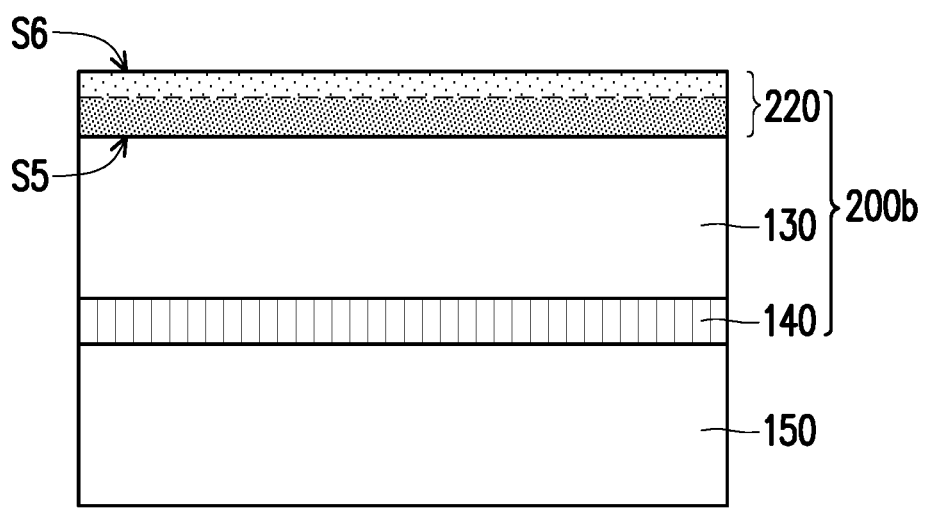

Referring to FIG. 2D, an electronic device 200d includes the protective structure 200b as shown in FIG. 2B and the electronic element 150. The protective structure 200b is disposed on the electronic element 150, that is, the optical structure layer 140 is sandwiched between the substrate 130 and the electronic element 150.

The Young's modulus of the hard coating layer 220 of the protective structures 200a to 200b is gradually increased from the second surface S6 toward the first surface S5, so the electronic device 200c having the protective structure 200a and the electronic device 200d having the protective structure 200b may have improved scratch resistance and have good flexibility at the same time, and the material cracking phenomenon of the electronic devices 200c to 200d after folding (especially outward folding) may also be reduced, so the service life and reliability of the electronic devices 200c to 200d may be increased. In addition, since the protective structures 200a to 200b adopt only a single layer of the hard coating layer 220, process steps may be further reduced to improve production efficiency.

Figure 3A:
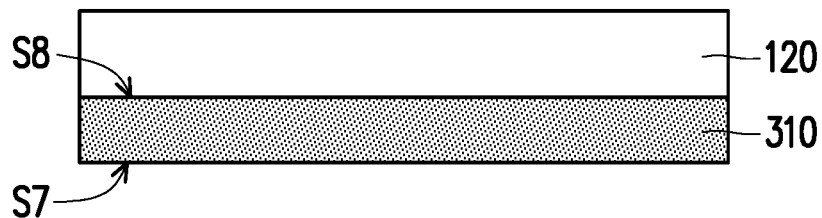

Referring to FIG. 3A, a protective structure 300a includes an auxiliary layer 310 and the hard coating layer 120 located on the auxiliary layer 310. The auxiliary layer 310 has a first surface S7 and a second surface S8 opposite to the first surface S7, and the hard coating layer 120 is located on the second surface S8 of the auxiliary layer 310. In some embodiments, the second surface S8 of the auxiliary layer 310 is closer to the hard coating layer 120 than the first surface S7 of the auxiliary layer 310. The Young's modulus of the auxiliary layer 310 is different from the Young's modulus of the hard coating layer 120. The Young's modulus of the auxiliary layer 310 is greater than the Young's modulus of the hard coating layer 120. In some embodiments, the auxiliary layer 310 and the hard coating layer 120 respectively have a fixed Young's modulus. The material of the auxiliary layer 310 is a homogenous structure to the hard coating layer 120. The material of the auxiliary layer 310 may be the same as that of the hard coating layer 120 to improve the adhesion at the interface between the auxiliary layer 310 and the hard coating layer 120 and to reduce the possibility of separation between the auxiliary layer 310 and the hard coating layer 120.

In some embodiments, the auxiliary layer 310 may be an organic material, and an inorganic material may be doped in the organic material, so that the Young's modulus of the auxiliary layer 310 may be changed by adjusting the doping concentration of the inorganic material to make the Young's modulus of the auxiliary layer 310 greater than the Young's modulus of the hard coating layer 120. The hard coating layer 120 may include an organic material. In other words, the auxiliary layer 310 and the hard coating layer 120 adopt the same organic material as the host material. For example, the organic materials of the auxiliary layer 310 and the hard coating layer 120 are both made of an acrylic material as a host material. The inorganic material and organic material of the auxiliary layer 310 may be similar to those described for the auxiliary layer 110 of FIG. 1A and are not repeated herein.

Figure 3B:
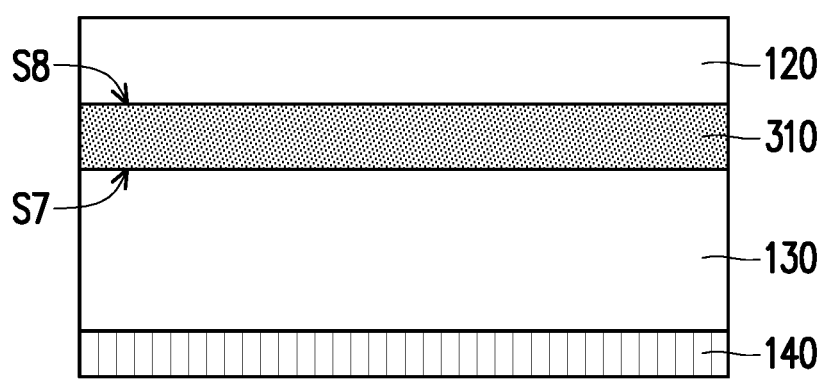

Referring to FIG. 3B, a protective structure 300b is similar to the protective structure 300a in FIG. 3A, and the difference is that the protective structure 300b further includes the substrate 130 and the optical structure layer 140. The auxiliary layer 310 is located at one side of the substrate 130, and the optical structure layer 140 is located at another side of the substrate 130. In other words, the substrate 130 is sandwiched between the auxiliary layer 310 and the optical structure layer 140. In some other embodiments, the protective structure is similar to the protective structure 300b, but does not include the optical structure layer 140.

Figure 3C:
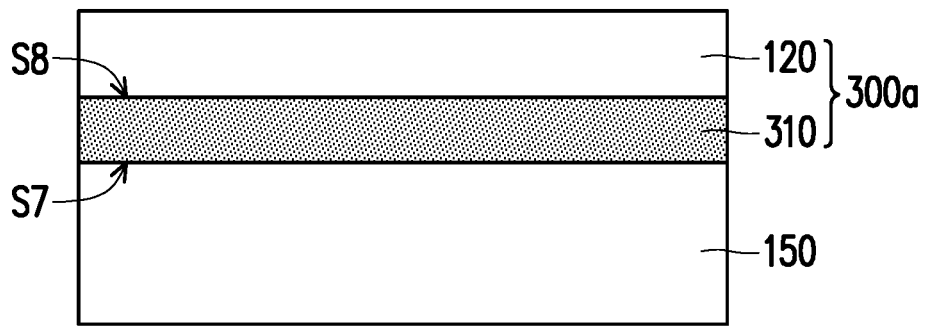

Referring to FIG. 3C, an electronic device 300c includes the protective structure 300a as shown in FIG. 3A and the electronic element 150. The protective structure 300a is located on the electronic element 150, in other words, the auxiliary layer 310 is located between the electronic element 150 and the hard coating layer 120.

Figure 3D:
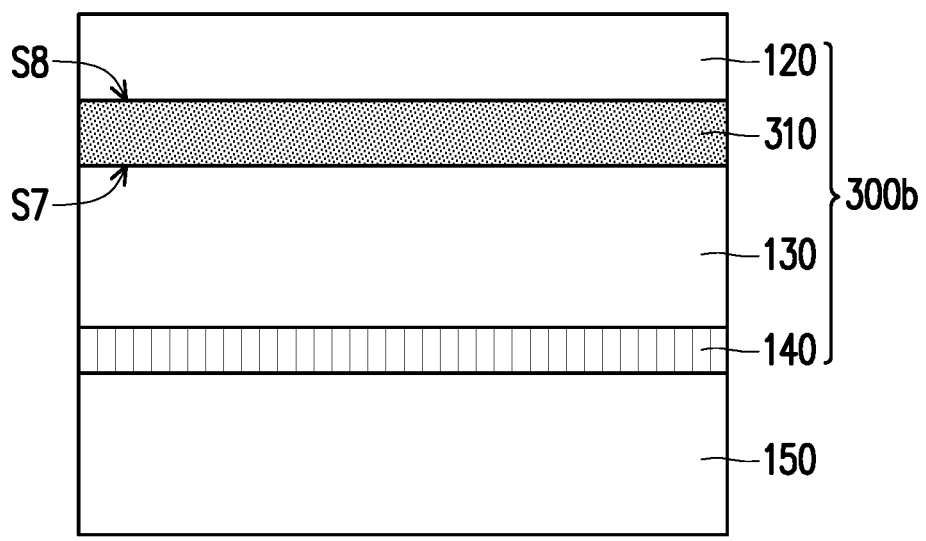

Referring to FIG. 3D, an electronic device 300d includes the protective structure 300b as shown in FIG. 3B and the electronic element 150. The protective structure 300b is disposed on the electronic element 150. In other words, the optical structure layer 140 is located between the electronic element 150 and the substrate 130. The substrate 130 is sandwiched between the coating layer 120 and the electronic element 150.

The Young's modulus of the auxiliary layer 310 of the protective structures 300a to 300b is greater than the Young's modulus of the hard coating layer 120, so the electronic device 300c having the protective structure 300a and the electronic device 300d having the protective structure 300b may have improved scratch resistance and have good flexibility at the same time, and the material cracking phenomenon of the electronic devices 300c to 300d after folding (especially outward folding) may also be reduced, thereby increasing the service life and reliability of the electronic devices 300c to 300d. In addition, since the material of the auxiliary layer 310 of the protective structures 300a to 300b is the same as that of the hard coating layer 120, the adhesion at the interface between the auxiliary layer 310 and the hard coating layer 120 may be improved, and the service life and reliability of the electronic devices 300c to 300d are further improved.

The following is an explanation of the efficacy of the protective structures of the embodiments of the disclosure via experiments and simulations.

Example 1

A stacked structure A was provided. The stacked structure A is similar to the protective structure 100b described in FIG. 1B, but does not include the optical structure layer 140. The forming method of the stacked structure A includes providing the substrate 130. The substrate 130 was polyethylene terephthalate (PET) and had a thickness of 125 μm. Next, the auxiliary layer 110 and the hard coating layer 120 were formed on the substrate 130. The forming method of the auxiliary layer 110 and the hard coating layer 120 includes first uniformly dispersing silicon dioxide having a concentration of 10 wt % in acrylic using a solvent. Next, a soft baking (85° C. to 105° C.) and a UV curing process were performed to volatilize the solvent in the organic material. The photocuring energy was, for example, 500 mj to 2500 mj. The formed auxiliary layer 110 was acrylic doped with silicon dioxide and having a thickness of 10 μm. From the second surface S2 to the first surface S1, the concentration of silicon dioxide was 1 wt % to 10 wt %, so that the Young's modulus of the auxiliary layer 110 was gradually increased from the second surface S2 toward the first surface S1. The hard coating layer 120 was an acrylic not doped with silicon dioxide and having a thickness of 10 μm. Next, the stacked structure A was subjected to a surface hardness test. The surface hardness of the stacked structure A actually measured was 7H (pencil hardness).

Comparative Example 1

A stacked structure A' was provided. The stacked structure A' is similar to the stacked structure A but does not have the auxiliary layer 110. Hardness testing was performed on the stacked structure A'. The surface hardness of the stacked structure A' actually measured was 5H (pencil hardness).

From the results of example 1 and comparative example 1, it may be seen that the configuration of the auxiliary layer increased the hardness of the surface of the overall structure.

Example 2

A stacked structure B was provided and tested for surface hardness. The stacked structure B is similar to the protective structure 100b described in the embodiment of FIG. 1B, that is, the stacked structure B includes the optical structure layer 140, an adhesive layer (not shown in FIG. 1B), the substrate 130, the auxiliary layer 110, and the hard coating layer 120. A polyimide phase (PI) substrate 130 having a thickness of 10 μm was provided, and then the auxiliary layer 110 and the hard coating layer 120 were formed on the substrate 130 in a manner similar to the stacked structure A. Thereafter, the optical structure layer 140 was adhered to the substrate 130 with an adhesive layer having a thickness of 2 μm. The optical structure layer 140 was a circular polarizer having a thickness of 5 to 50 μm. The auxiliary layer 110 was an acrylic material doped with silicon dioxide and having a thickness of 10 μm. The concentration of silicon dioxide was 10 wt % to 35 wt % from the second surface S2 to the first surface S1 such that the Young's modulus of the auxiliary layer 110 was gradually increased from the second surface S2 toward the first surface S1. The formed hard coating layer 120 was an acrylic material having a thickness of 20 μm. The surface hardness of the stacked structure B actually measured was 8H (pencil hardness).

Comparative Example 2

A stacked structure B' was provided. The stacked structure B' is similar to the stacked structure B but does not have the auxiliary layer 110. Hardness testing was performed on the stacked structure B'. The surface hardness of the stacked structure B' actually measured was 6H (pencil hardness).

From the results of example 2 and comparative example 2, it may be seen that the configuration of the auxiliary layer increased the hardness of the surface of the overall structure.

Example 3

A stacked structure C was provided. The structure of the stacked structure C is similar to the stacked structure B, and the difference is the doping concentration of silicon dioxide in the auxiliary layer 110. In the stacked structure C, the concentration of silicon dioxide in the auxiliary layer 110 was 15 wt % to 30 wt % from the second surface S2 to the first surface S1. The surface hardness of the stacked structure C actually measured was 8H (pencil hardness).

Example 4

A stacked structure D was provided. The stacked structure D is similar to the stacked structure A, and the difference is that the hard coating layer 120 was an acrylic material doped with silicon dioxide. The concentration of silicon dioxide in the hard coating layer 120 was 1 wt % to 5 wt %. The surface hardness of the stacked structure C actually measured was 8H (pencil hardness).

Example 5

A stacked structure E was provided. The structure of the stacked structure E is similar to the stacked structure B, and the difference is that the hard coating layer 120 was an acrylic material doped with silicon dioxide. The concentration of silicon dioxide in the hard coating layer 120 was 1 wt % to 5 wt %. The surface hardness of the structure actually measured was 8H (pencil hardness).

Example 6

A stacked structure J was provided. The stacked structure J is similar to the protective structure 100a described in the embodiment of FIG. 1A. That is, the stacked structure J includes the auxiliary layer 110 and the hard coating layer 120. The hard coating layer 120 was an undoped acrylic having a thickness of 20 μm. The auxiliary layer 110 was an acrylic doped with silicon dioxide and having a thickness of 10 μm. The stacking structure J was subjected to a simulation of bending stress, and the radius of curvature was 3 mm (millimeter). The results are shown in FIG. 1E and Table 1.

Figure 1E:
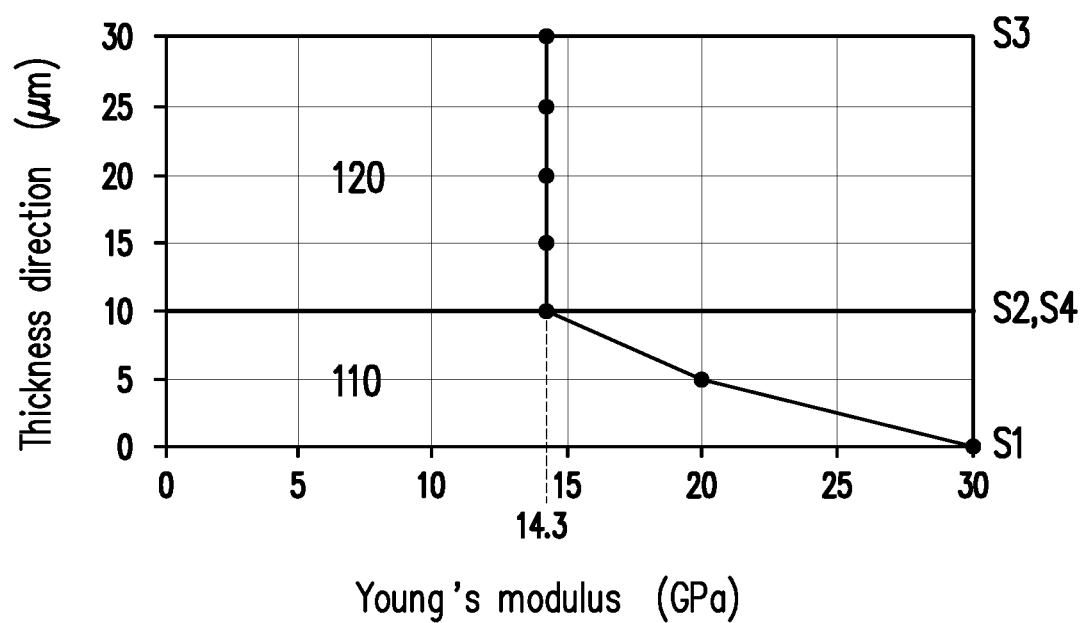
FIG. 1E shows the relationship between the thickness direction and the Young's modulus in the protective structure of FIG. 1A.

The results from FIG. 1E show that the Young's modulus of the hard coating layer 120 from the top surface S3 to the bottom surface S4 is kept at a constant, that is, the Young's modulus of the hard coating layer 120 at positions with thicknesses of 30 μm, 25 μm, 20 μm, and 15 μm is always kept at 14.3 GPa. The Young's modulus at the interface of the bottom surface S4 of the hard coating layer 120 and the auxiliary layer 110 is 14.3 GPa. The Young's modulus of the auxiliary layer 110 is gradually increased from the second surface S2 toward the first surface S1. The Young's modulus of the auxiliary layer 110 at positions with thicknesses of 10 μm, 5 μm, and 0 μm is sequentially 14.3 GPa, 20 GPa, and 30 GPa.

TABLE 1

| Young's modulus of hard coating layer 120 (GPa) | 14.3 | 14.3 | 14.3 | 14.3 |
|---|---|---|---|---|
| Young's modulus of auxiliary layer 110 (GPa) | 14.3 | 20 | 25 | 30 |
| Bending stress of protective structure 100a (MPa) | 315.16 | 297.43 | 284.25 | 272.83 |

It may be seen from the results of Table 1 that as the Young's modulus in the auxiliary layer 110 is greater, the bending stress is gradually smaller. When the Young's modulus of the auxiliary layer 110 is 30 GPa, the bending stress may be reduced to 272.83 MPa ($10^6$ Pa), which is less than the deflection strength of 278 MPa with a deflection radius of 3 mm.

Therefore, increasing the Young's modulus of the auxiliary layer 110 reduces the bending stress received, thereby reducing the chance of deformation of the auxiliary layer 110.

Example 7

An electronic device F was provided. The electronic device F is similar to electronic device 100d described in the embodiment of FIG. 1D. That is, the electronic device F includes the electronic element 150, the optical structure layer 140, the substrate 130, the auxiliary layer 110, and the hard coating layer 120. The electronic element 150 below the optical structure layer 140 includes, from top to bottom, a 12 μm optical transparent adhesive (OCA), a touch sensor, 19 7OCA, a thin film transistor/active matrix organic light-emitting diode (TFT/AMOLED), a 12 μm optically clear adhesive, and polyimine. The optical structure layer 140 was a circular polarizer having a thickness of 5 to 50 μm. The substrate 130 was a polyimide having a thickness of 9 to 30 μm. The auxiliary layer 110 was an acrylic material doped with silicon dioxide and having a thickness of 10 μm. The concentration of silicon dioxide was 15 wt % to 30 wt % from the second surface S2 to the first surface S1 such that the Young's modulus of the auxiliary layer 110 was gradually increased from the second surface S2 toward the first surface S1, and the hard coating layer 120 was an undoped acrylic material having a thickness of 20 μm. The surface hardness of the electronic device F was tested and the measured surface hardness was 7H (pencil hardness).

Example 8

An electronic device G was provided. The electronic device G is similar to the electronic device F of example 7, and the difference is that the hard coating layer 120 was an acrylic material doped with silicon dioxide. The concentration of silicon dioxide was 1 wt % to 5 wt % from the second surface S2 to the first surface S1. The surface hardness of the electronic device G was tested and the measured surface hardness was 7H (pencil hardness).

Example 9

An electronic device H was provided. The electronic device H is similar to electronic device 100d described in the embodiment of FIG. 1D. That is, the electronic device H includes the electronic element 150, the optical structure layer 140, the substrate 130, the auxiliary layer 110, and the hard coating layer 120. The electronic element 150 was an electronic element with touch function and display function (such as AMOLED). The optical structure layer 140 was a circular polarizer having a thickness of 5 μm. The substrate 130 was polyimine and a thickness of 9 to 12 μm. The substrate 130 was polyimine and had a thickness of 9 to 12 μm. The auxiliary layer 110 was an acrylic material doped with silicon dioxide and having a thickness of 10 μm. From the second surface S2 to the first surface S1, the concentration of the silicon dioxide doping was 20 wt % to 35 wt %, so that the Young's modulus of the auxiliary layer 110 was gradually increased from the second surface S2 toward the first surface S1. The hard coating layer 120 was an undoped acrylic material having a thickness of 10 μm. The electronic device H was subjected to a flexural test with a deflection radius of 3 mm. The electronic device H passed a flexural test of folding 20,000 times outward and a flexural test of folding 20,000 times inward, showing that the electronic device H had good flexibility.

In addition, a ball drop test and a surface hardness test were further performed on the electronic device H. The steel ball weighed 135 grams and was dropped from a height of 35 cm. The electronic device H passed the ball drop test and the measured surface hardness was 7H (pencil hardness), indicating that the electronic device H had considerable hardness and impact resistance.

Example 10

An electronic device I was provided. The electronic device I is similar to the electronic device 100d described in the embodiment of FIG. 1D. That is, the electronic device I includes the electronic element 150, the optical structure layer 140, the substrate 130, the auxiliary layer 110, and the hard coating layer 120. The electronic element 150 was an electronic element with touch function and display function (such as AMOLED). The optical structural layer 140 was a circular polarizer having a thickness of 5 µm. The substrate 130 was polyimine and had a thickness of 9 to 12 µm. The auxiliary layer 110 was an acrylic material doped with silicon dioxide and having a thickness of 5 µm. From the second surface S2 to the first surface S1, the concentration of the silicon dioxide doping was 20 wt % to 35 wt %, so that the Young's modulus of the auxiliary layer 110 was gradually increased from the second surface S2 toward the first surface S1. The hard coating layer 120 was an undoped acrylic material having a thickness of 10 µm. A flexural test was performed on the electronic device I with a deflection radius of 3 mm. The electronic device I passed a flexural test of folding 20,000 times outward and a flexural test of folding 20,000 times inward, which shows that the electronic device I had good flexibility.

In addition, a ball drop test and a surface hardness were performed on the electronic device I. The weight of the steel ball was 135 grams and the steel ball was dropped from a height of 35 cm. The electronic device I passed the ball drop test and the measured surface hardness was 7H (pencil hardness), indicating that the electronic device I had considerable hardness and impact resistance.

Based on the above, the Young's modulus of the auxiliary layer or the hard coating layer of the protective structure of an embodiment of the disclosure is gradually increased from the second surface to the first surface, so that the electronic device having the above protective structure may have improved scratch resistance and have good flexibility, and the material cracking phenomenon of the electronic device after folding (especially outward folding) may also be reduced, thereby increasing the service life and reliability of the electronic device.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A protective structure, comprising:
   an auxiliary layer having a first surface and a second surface opposite to the first surface; and
   a coating layer located on the second surface of the auxiliary layer, wherein the second surface of the auxiliary layer is closer to the coating layer than the first surface of the auxiliary layer, and a Young's modulus of the auxiliary layer is greater than a Young's modulus of the coating layer, and the auxiliary layer and the coating layer comprise a same host material.

2. The protective structure of claim 1, wherein the auxiliary layer comprises an organic material doped with an inorganic material, the coating layer comprises an organic material, and the organic material of the auxiliary layer is the same as the organic material of the coating layer.

3. The protective structure of claim 2, wherein the inorganic material is a nanoparticle, and the nanoparticle comprises silicon dioxide, titanium oxide, zirconium oxide, or a combination thereof.

4. The protective structure of claim 1, further comprising:
   a substrate disposed on the first surface of the auxiliary layer; and
   an optical structure layer, wherein the substrate is located between the auxiliary layer and the optical structure layer.

5. The protective structure of claim 1, further comprising:
   a substrate disposed on the first surface of the auxiliary layer.

6. An electronic device, comprising:
   the protective structure of claim 1; and
   an electronic element disposed on the first surface of the auxiliary layer.

7. An electronic device, comprising:
   the protective structure of claim 1;
   an electronic element; and
   a substrate, wherein the substrate is sandwiched between the coating layer and the electronic element.

8. An electronic device, comprising:
   the protective structure of claim 4; and
   an electronic element disposed on a surface of the optical structure layer away from the substrate.

* * * * *